US012635357B2

(12) United States Patent
Ding et al.

(10) Patent No.: US 12,635,357 B2
(45) Date of Patent: May 19, 2026

(54) DISPLAY PANEL AND FABRICATION METHOD THEREOF, AND MOBILE TERMINAL

(71) Applicant: Wuhan China Star Optoelectronics Semiconductor Display Technology Co., Ltd., Wuhan (CN)

(72) Inventors: Ding Ding, Wuhan (CN); Liang Fang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 391 days.

(21) Appl. No.: 17/620,021

(22) PCT Filed: Nov. 29, 2021

(86) PCT No.: PCT/CN2021/133802
§ 371 (c)(1),
(2) Date: Jun. 23, 2023

(87) PCT Pub. No.: WO2023/087373
PCT Pub. Date: May 25, 2023

(65) Prior Publication Data
US 2024/0107822 A1      Mar. 28, 2024

(30) Foreign Application Priority Data

Nov. 18, 2021      (CN) .......................... 202111371104.X

(51) Int. Cl.
*H10K 59/124*      (2023.01)
*H10K 59/12*      (2023.01)
(52) U.S. Cl.
CPC ....... *H10K 59/124* (2023.02); *H10K 59/1201* (2023.02)

(58) Field of Classification Search
CPC ........... H10K 59/1201; H10K 59/1213; H10K 59/124
See application file for complete search history.

(56) References Cited

U.S. PATENT DOCUMENTS 12,471,313 B2 * 11/2025 Yeon .................. H10D 30/6745
2005/0074914 A1 * 4/2005 Chang ................ H10D 30/0314
257/E29.279
(Continued)

FOREIGN PATENT DOCUMENTS

CN      109300915 A      2/2019
CN      110444553 A      11/2019
(Continued)

OTHER PUBLICATIONS

International Search Report in International application No. PCT/CN2021/133802, mailed on Aug. 19, 2022.
(Continued)

*Primary Examiner* — Shaun M Campbell
(74) *Attorney, Agent, or Firm* — PV IP PC; Peter Stecher; Wei Te Chung

(57)      ABSTRACT

The present application provides a display panel, a fabrication method thereof, and a mobile terminal. The display panel includes a substrate and a driving circuit layer. The driving circuit layer includes a first active layer, a first gate insulating layer, a first gate, a first interlayer insulating layer, and a source and drain layer. An orthographic projection of the first gate insulating layer on the substrate is within an orthographic projection of the first active layer on the substrate, and an orthographic projection the first gate on the substrate is located within an orthographic projection of the first gate insulating layer on the substrate.

20 Claims, 9 Drawing Sheets

(56) References Cited

U.S. PATENT DOCUMENTS

| | | | | |
|---|---|---|---|---|
| 2015/0187878 A1* | 7/2015 | Yamazaki | ......... | G02F 1/133514 |
| | | | | 257/43 |
| 2015/0255612 A1* | 9/2015 | Yamazaki | .......... | H10D 30/6713 |
| | | | | 257/43 |
| 2016/0254334 A1 | 9/2016 | Yang et al. | | |
| 2017/0018577 A1* | 1/2017 | Matsuda | .............. | H10D 62/405 |
| 2017/0179164 A1 | 6/2017 | Choi et al. | | |
| 2020/0161477 A1* | 5/2020 | Lim | ..................... | H10D 86/423 |
| 2021/0020110 A1* | 1/2021 | Park | ................... | H10K 59/1213 |
| 2021/0135012 A1* | 5/2021 | Song | ...................... | H10D 62/80 |
| 2021/0384314 A1* | 12/2021 | Yamazaki | ............ | H10D 30/673 |
| 2022/0115540 A1* | 4/2022 | Cheng | .................. | H10D 30/673 |
| 2022/0254852 A1* | 8/2022 | Wang | ..................... | H10D 99/00 |
| 2024/0038898 A1* | 2/2024 | Jintyou | ..................... | G09F 9/30 |

FOREIGN PATENT DOCUMENTS

| | | | |
|---|---|---|---|
| CN | 110556386 A | 12/2019 | |
| CN | 111180524 A | 5/2020 | |
| CN | 112992936 A | 6/2021 | |
| WO | 2021134422 A1 | 7/2021 | |

OTHER PUBLICATIONS

Written Opinion of the International Searching Authority in International application No. PCT/CN2021/133802, mailed on Aug. 19, 2022.

Chinese Office Action issued in corresponding Chinese Patent Application No. 202111371104.X dated Jun. 22, 2023, pp. 1-7.

* cited by examiner

DISPLAY PANEL AND FABRICATION METHOD THEREOF, AND MOBILE TERMINAL

CROSS-REFERENCE TO RELATED APPLICATION

This application is a national phase application under 35 U.S.C. § 371 of PCT Application No. PCT/CN2021/133802 filed Nov. 29, 2021, which claims priority to Chinese Application No. 202111371104.X filed Nov. 18, 2021, the contents of which are incorporated herein by reference in their entirety.

FIELD OF INVENTION

The present application relates to a display technology field, and particularly to a display panel and a fabrication method thereof, and a mobile terminal.

BACKGROUND

In recent years, quality requirements for display panels have become higher and higher. An active layer without special treatment has a large resistance, which will affect a resistance of source and drain regions, thereby affecting the mobility. In order to reduce the resistance of the active layer, the source and drain regions are usually processed, such as using a gate self-alignment method to pattern a gate insulating layer so that the gate and the gate insulating layer have the same line width, and plasma gas is used to treat the source and drain regions to reduce its resistance to make thereof conductive. However, the plasma gas in the source and drain regions will diffuse to the channel region along the channel layer, causing the actual channel length to be shortened, which will seriously affect a threshold voltage of the device, thereby affecting the display panel's performance quality.

Therefore, there is an urgent need for a display panel and a fabrication method thereof, and a mobile terminal to solve the above technical problems.

SUMMARY OF DISCLOSURE

The embodiments of the present application provide a display panel, a fabrication method thereof, and a mobile terminal to solve the technical problem that the plasma gas will diffuse in the source and drain regions along the channel layer to the channel region, causing the actual channel length to be shortened.

In order to solve the above problems, technical solutions provided by the present application are as follows:

An embodiment of the present application provides a display panel, comprising:

a substrate;

a driving circuit layer arranged on a side of the substrate, wherein the driving circuit layer comprises a first active layer, a first gate insulating layer arranged on a side of the first active layer away from the substrate, a first gate arranged on a side of the first gate insulating layer away from the substrate, a first interlayer insulating layer arranged on a side of the first gate away from the substrate, and a source and drain layer arranged on a side of the first interlayer insulating layer is away from the substrate, wherein the source and drain layer comprises a first source and a first drain;

wherein an orthographic projection of the first gate insulating layer on the substrate is within an orthographic projection of the first active layer on the substrate, and an orthographic projection of the first gate on the substrate is located within an orthographic projection of the first gate insulating layer on the substrate.

Preferably, the first active layer comprises a first source conductor region, a first channel region, a first drain conductor region, and a first diffusion region between the first source conductor region and the first channel region, and a second diffusion region between the first drain conductor region and the first channel region, wherein the first source is electrically connected to the first source conductor region, and the first drain is electrically connected to the first drain conductor region; and wherein the first interlayer insulating layer covers at least the first channel region, the first diffusion region, and the second diffusion region.

Preferably, in a top view direction of the display panel, the first gate insulating layer completely overlaps the first channel region, the first diffusion region, and the second diffusion region completely overlaps the first gate and the first channel region.

Preferably, the first active layer includes a plurality of oxygen vacancies; oxygen vacancy concentrations of the first source conductor region and the first drain conductor region are both greater than oxygen vacancy concentrations of the first diffusion region and the second diffusion region; and oxygen vacancy concentrations of the first diffusion region and the second diffusion region are both greater than an oxygen vacancy concentration of the first channel region.

Preferably, the first active layer further comprises a third diffusion region located on a side of the first source conductor region away from the first channel region, and a fourth diffusion region located on a side of the first drain conductor region away from the first channel region; wherein, the oxygen vacancy concentration of the first source conductor region is greater than the oxygen vacancy concentration of the third diffusion region, and the oxygen vacancy concentration of the first drain conductor region is greater than the oxygen vacancy concentration of the fourth diffusion region.

Preferably, the ratio of a sum of a width of the first diffusion region and a width of the second diffusion region to a width of the first channel region is less than 1:1.

Preferably, the first gate insulating layer comprises a first cell corresponding to the first gate and a second cell located outside the first cell, so the first unit is connected to the second unit; and wherein a thickness of the second unit is smaller than a thickness of the first unit.

Preferably, the driving circuit layer further comprises a second gate corresponding to the first gate, and the second gate is located on a side of the first gate far away from the first active layer; wherein the driving circuit layer further comprises a second active layer, a third gate, a fourth gate located between the second active layer and the third gate, and a second source and a second drain; and wherein the third gate electrode and the second gate electrode are arranged in the same layer, and the first source electrode, the first drain electrode, the second source electrode and the second drain electrode are arranged in the same layer.

An embodiment of the present application provides a fabrication method of a display panel, comprising:

forming a first active layer on a substrate;

sequentially forming a first insulating film layer and a first gate film layer on the first active layer;

forming a photoresist layer on the first insulating film layer and the first gate film layer;

forming the first insulating film layer, the first gate film layer, and the photoresist layer into a first pattern by a patterning process to expose a part of the first active layer;

making the exposed first active layer conductive by a plasma process;

forming the photoresist layer into a continuously arranged second pattern by a develop process, wherein an area of the second pattern is smaller than an area of the first pattern to expose a part of the first gate film layer;

wherein the exposed first gate film layer is removed to form a first gate and a first gate insulating layer.

Preferably, forming the first insulating film layer, the first gate film layer, and the photoresist layer into a first pattern by a patterning process to expose a part of the first active layer comprises following steps: forming the first insulating film layer, the first gate film layer, and the photoresist layer into a first pattern by a patterning process to expose a periphery of the first active layer.

Preferably, forming the first insulating film layer, the first gate film layer, and the photoresist layer into a first pattern by a patterning process to expose a part of the first active layer comprises following steps: forming the first insulating film layer, the first gate film layer, and the photoresist layer into a first pattern, and the first pattern including a plurality of openings; wherein the photoresist layer is provided around the plurality of openings.

Preferably, the fabrication method of the display panel further comprises: forming a first interlayer insulating layer including a first layer of a plurality of openings on the first active layer, the first insulating layer, and the first layer, wherein the plurality of openings expose the first active layer; and forming a source electrode and a first electrode on the first interlayer insulating layer.

An embodiment of the present application provides a mobile terminal including a display panel and a mobile body, wherein the mobile body is integrated with the display panel:

wherein the display panel comprises:

a substrate;

a driving circuit layer arranged on a side of the substrate, wherein the driving circuit layer comprises a first active layer, a first gate insulating layer arranged on a side of the first active layer away from the substrate, a first gate arranged on a side of the first gate insulating layer away from the substrate, a first interlayer insulating layer arranged on a side of the first gate away from the substrate, and a source and drain layer arranged on a side of the first interlayer insulating layer is away from the substrate, wherein the source and drain layer comprises a first source and a first drain;

wherein an orthographic projection of the first gate insulating layer on the substrate is within an orthographic projection of the first active layer on the substrate, and an orthographic projection the first gate on the substrate is located within an orthographic projection of the first gate insulating layer on the substrate.

Preferably, the first active layer comprises a first source conductor region, a first channel region, a first drain conductor region, and a first diffusion region between the first source conductor region and the first channel region, and a second diffusion region between the first drain conductor region and the first channel region, wherein the first source is electrically connected to the first source conductor region, and the first drain is electrically connected to the first drain conductor region; and wherein the first interlayer insulating layer covers at least the first channel region, the first diffusion region, and the second diffusion region.

Preferably, in a top view direction of the display panel, the first gate insulating layer completely overlaps the first channel region, the first diffusion region, and the second diffusion region completely overlaps the first gate and the first channel region.

Preferably, the first active layer includes a plurality of oxygen vacancies; oxygen vacancy concentrations of the first source conductor region and the first drain conductor region are both greater than oxygen vacancy concentrations of the first diffusion region and the second diffusion region; and oxygen vacancy concentrations of the first diffusion region and the second diffusion region are both greater than an oxygen vacancy concentration of the first channel region.

Preferably, the first active layer further comprises a third diffusion region located on a side of the first source conductor region away from the first channel region, and a fourth diffusion region located on a side of the first drain conductor region away from the first channel region; wherein, the oxygen vacancy concentration of the first source conductor region is greater than the oxygen vacancy concentration of the third diffusion region, and the oxygen vacancy concentration of the first drain conductor region is greater than the oxygen vacancy concentration of the fourth diffusion region.

Preferably, the ratio of a sum of a width of the first diffusion region and a width of the second diffusion region to a width of the first channel region is less than 1:1.

Preferably, the first gate insulating layer comprises a first cell corresponding to the first gate and a second cell located outside the first cell, so the first unit is connected to the second unit; and wherein a thickness of the second unit is smaller than a thickness of the first unit.

Preferably, the driving circuit layer further comprises a second gate corresponding to the first gate, and the second gate is located on a side of the first gate far away from the first active layer; the driving circuit layer further comprises a second active layer, a third gate, a fourth gate located between the second active layer and the third gate, and a second source and a second drain; and the third gate electrode and the second gate electrode are arranged in the same layer, and the first source electrode, the first drain electrode, the second source electrode and the second drain electrode are arranged in the same layer.

In the present application, a size of a first gate is made to be smaller than a size of the first gate insulating layer, the size of the first gate insulating layer is made to be smaller than a size of the first active layer, and a distance of the diffusion region of the plasma gas is reserved when making an active layer conductive by a self-aligned method and uses of the first gate and the first gate insulating layer, thereby effectively preventing the channel region from being shortened, ensuring an effective channel region length, preventing a threshold voltage drift, and improving the quality of the display panel.

BRIEF DESCRIPTION OF DRAWINGS

In order to more clearly illustrate technical solutions in embodiments of the present disclosure, a brief description of accompanying drawings used in a description of the embodiments will be given below. Obviously, the accompanying drawings in the following description are merely some embodiments of the present disclosure. For those skilled in the art, other drawings may be obtained from these accompanying drawings without creative labor.

DETAILED DESCRIPTION

Figures 1, 2:
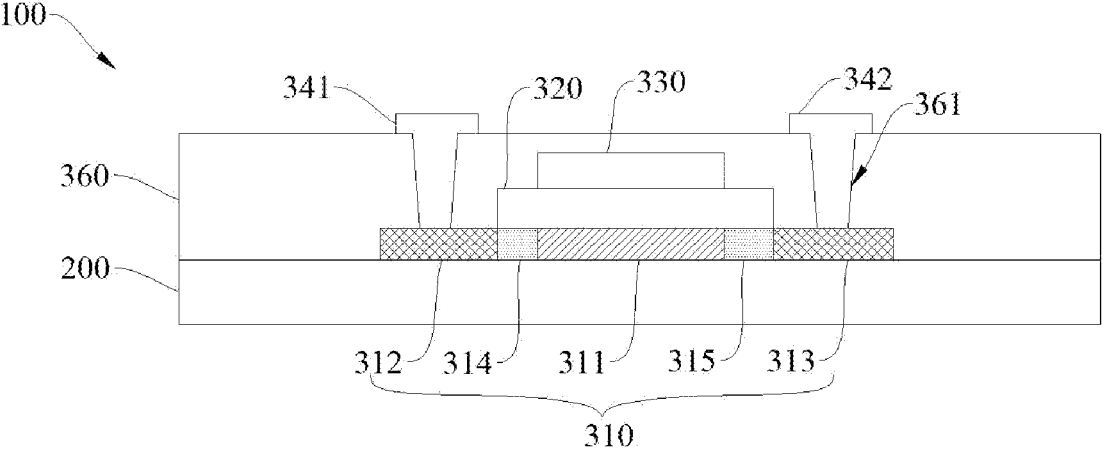
FIG. 1 is a schematic structural diagram of a first structure of a display panel provided by an embodiment of the present invention.
FIG. 2 is a schematic structural diagram of a second structure of a display panel provided by an embodiment of the present invention.

The embodiments of the present application provide a display panel and a fabrication method thereof, and a mobile terminal. Detailed descriptions are given below. It should be noted that the order of description in the following embodiments is not intended to limit the preferred order of the embodiments.

Embodiments of the present application provides a display panel, a fabrication method thereof, and a mobile terminal. Detailed descriptions are given below. It should be noted that the order of description in the following embodiments is not meant to limit the preferred order of the embodiments.

Please refer to FIG. 1 to FIG. 6, embodiments of the present invention provide a display panel 100, comprising:

a substrate 200;

a driving circuit layer arranged on a side of the substrate 200, wherein the driving circuit layer comprises a first active layer 310, a first gate insulating layer 320 arranged on a side of the first active layer 310 away from the substrate 200, a first gate 330 arranged on a side of the first gate insulating layer 320 away from the substrate 200, a first interlayer insulating layer 360 arranged on a side of the first gate away from the substrate 200, a source and drain layer arranged on a side of the first interlayer insulating layer 360 away from the substrate 200, and the source and drain layer comprises a first source 341 and a first drain 342, Herein, an orthographic projection of the first gate insulating layer 320 on the substrate 200 is within an orthographic projection of the first active layer 310 on the substrate 200, and an orthographic projection the first gate 330 on the substrate 200 is within an orthographic projection of the first gate insulating layer 320 on the substrate.

In the present invention, the size of the first gate is smaller than the size of the first gate insulating layer, the size of the first gate insulating layer is smaller than the size of the first active layer, and a distance of a diffusion region formed by the plasma gas is reserved when making the first active layer conductive through a self-aligned method and uses of the first gate and the first gate insulating layer, thereby effectively prevent the channel region from being shortened, ensuring the effective channel region length, preventing threshold voltage drift, and improving the quality of the display panel.

Technical solutions of the present invention will now be described in conjunction with specific embodiments.

In this embodiment, referring to FIG. 1, the display panel 100 comprises a substrate 200; and a driving circuit layer arranged on a side of the substrate 200, wherein the driving circuit layer comprises a first active layer 310, a first gate insulating layer 320 arranged on a side of the first active layer 310 away from the substrate 200, a first gate 330 arranged on a side of the first gate insulating layer 320 away from the substrate 200, a first interlayer insulating layer 360 arranged on a side of the first gate away from the substrate 200, a source and drain layer arranged on a side of the first interlayer insulating layer 360 away from the substrate 200, and the source and drain layer comprises a first source 341 and a first drain 342.

An orthographic projection of the first gate insulating layer 320 on the substrate 200 is within an orthographic projection of the first active layer 310 on the substrate 200, and an orthographic projection the first gate 330 on the substrate 200 is within an orthographic projection of the first gate insulating layer 320 on the substrate 200.

The size of the first gate is smaller than the size of the first gate insulating layer, the orthographic projection of the first gate insulating layer 320 on the substrate 200 is within the orthographic projection of the first active layer 310 on the substrate 200, a distance of the diffusion region of the plasma gas is reserved, thereby effectively prevent the channel region from being shortened. The orthographic projection the first gate 330 on the substrate 200 is located within an orthographic projection of the first gate insulating layer 320 on the substrate 200, which can ensure an effective channel length, prevent threshold voltage drift, and improve the quality of the display panel 100.

In some embodiments, referring to FIG. 1, the first active layer comprises a first source conductor region 312, a first channel region 311, a first drain conductor region 313, a first diffusion region 314 between the conductor region 312 and the first channel region 311, and a second diffusion region 315 between the first drain conductor region 313 and the first channel region 311. The first source 341 is electrically connected to the first source conductor region 312, the first drain 342 is electrically connected to the first drain conductor region 313. The first interlayer insulating layer 360 at least covers the first channel region 311, the first diffusion region 314, and the second diffusion region 315.

The first channel region 311 corresponds to the channel region of the semiconductor, the first source conductor region 312 and the first drain conductor region 313 correspond to the source and drain regions, which are the conductive regions having strong conductivity. The first diffusion region 314 and the second diffusion region 315 correspond to the diffusion region of the plasma gas, having a resistance between the first channel region and the regions which are made conductive. A distance of a diffusion region formed by the plasma gas is reserved, which effectively prevents the channel from being shortened, ensures the effective channel length, prevent the threshold voltage from drifting, and improves the quality of the display panel 100.

In some embodiments, in the top view direction of the display panel 100, the first gate insulating layer 320 and the first channel region 311, the first diffusion region 314, and the second diffusion region 315 are completely overlapped, and the first gate 330 is overlapped with the first channel region 311.

A part of the first gate insulating layer 320 has the function of protecting the diffusion region, and the size of the first channel region 311 corresponding to the channel region is made to correspond the first gate 330, thereby ensuring the effective channel length and preventing the threshold value shift, and improving the quality of the display panel 100.

In some embodiments, referring to FIG. 1, the display panel further comprises the first interlayer insulating layer 360 having a plurality of opening 361 formed on the first active layer 310, the first gate insulating layer 320, and the first gate 330. The first openings 361 expose the first active layer 310.

In some embodiments, please refer to FIG. 1. For the convenience of description, the insulating material between the first active layer 310 and the first source-drain unit 340 is the first interlayer insulating layer 360. The material of the first interlayer insulating layer 360 is an insulating material.

Figure 3:
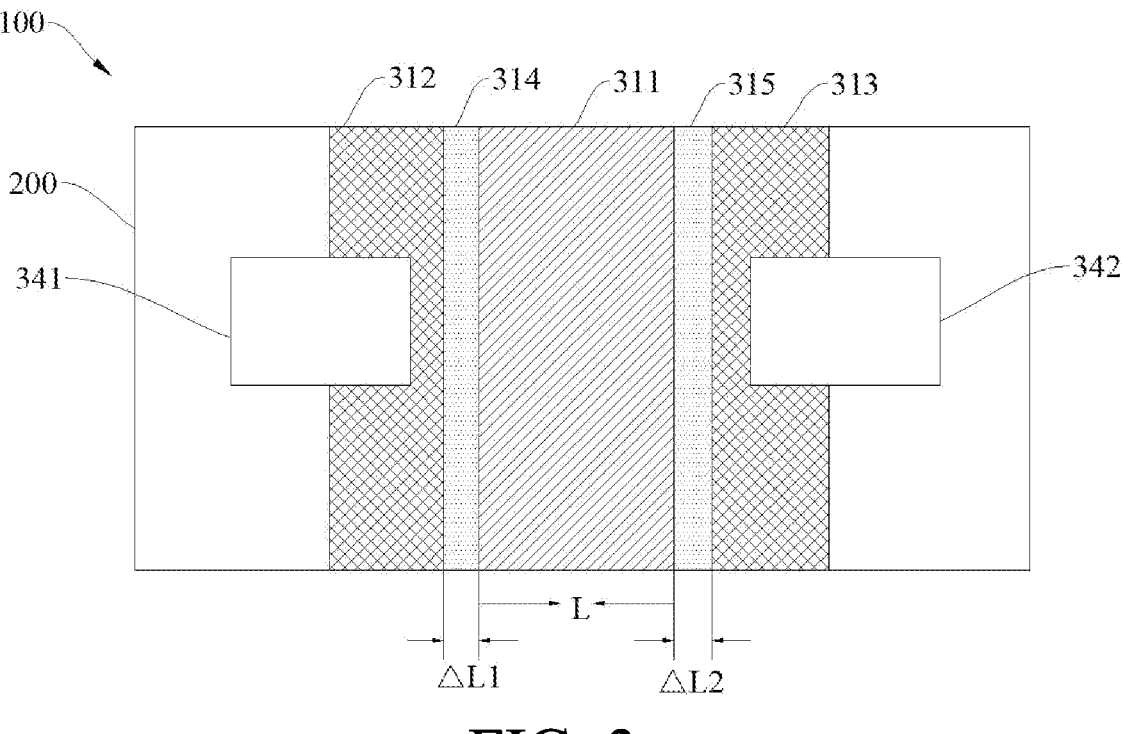
FIG. 3 is a schematic top view of FIG. 1 or FIG. 2.

In some embodiments, referring to FIGS. 2 and 3, the first gate insulating layer 320 comprises a first unit 321 corresponding to the first gate 330, and a second unit 322 located outside the first cell 321. The first unit 321 is connected to the second unit 322, wherein the thickness of the second unit 322 is smaller than the thickness of the first unit 321.

After the first active layer 310 is made conductive through a self-aligned method and uses of the first gate 330 and the first gate insulating layer 320, the distance of the diffusion area of the plasma gas is reserved. In the direction of a carrier migration, after the first gate 330 is etched corresponding to the plasma gas diffusion distance, the first gate insulating layer 320 that is not covered by the first gate 330 will also be thinned Therefore, in the display panel 100 formed by the fabrication method of the present invention, the thickness of the second unit 322 is smaller than the thickness of the first unit 321, and this structure can be used as an anti-counterfeiting mark.

In some embodiments, the width of the second unit 322 may be equal to or different from the widths of the first diffusion region 314 and the second diffusion region 315.

In some embodiments, the ratio of the sum of the width of the first diffusion region 314 and the width of the second diffusion region 315 to the width of the first channel region 311 is less than 1:1.

Please refer to FIG. 2 and FIG. 3, according to different plasma gas process parameters, or according to different channel region length settings, the total length of the diffusion region should not exceed half of the sum of the diffusion region and the channel region, that is, the ratio of the sum of the width of the first diffusion region 314 and the width of the second diffusion region 315 to the width of the first channel region 311 is less than 1:1. Herein the width of the first channel region 311 is represented by L. It means that the width of the first diffusion area 314 and the width of the second diffusion area 315 are represented by $\Delta L1$ and $\Delta L2$ respectively, and the total length of the diffusion area is $\Delta L1+\Delta L2$. Not only can the effective channel length be ensured, the threshold voltage can be prevented from drifting, but also the on-state current of the first thin film transistor can be increased, and the working efficiency of a thin film transistor can be improved.

In some embodiments, the first active layer 310 includes a plurality of oxygen vacancies. The oxygen vacancy concentration of the first source conductor region 312 and the first drain conductor region 313 are greater than that of the first diffusion region 314 and the second diffusion region 315. The oxygen vacancy concentration of the diffusion region 314 and the second diffusion region 315 are greater than the oxygen vacancy concentration of the first channel region 311.

For the resistance reduction process using the plasma gas bombardment of examples such as He, Ar, $CF_4$, etc., $CF_4$ can measure the F content or oxygen vacancy content in the final product. For He and Ar, the oxygen bond is bombarded and broken to form oxygen vacancy that can be only detected by the oxygen vacancy content, so the oxygen vacancy concentration can be used as a distinction between different regions. The first channel region 311 corresponds to the channel region of the semiconductor, having the smallest oxygen vacancy concentration. The first source conductor region 312 and the first drain conductor region 313 corresponds to the source and drain regions which are made conductive and have strong conductivity and maximum oxygen vacancy concentration. The first diffusion region 314 and the second diffusion region 315 correspond to the active diffusion region of the plasma gas has a resistance between the first channel region 311 and the region being made conductive, and the oxygen vacancy concentration is between both thereof to ensure the effective channel length, prevent threshold voltage drift, and improve the quality of the display panel 100.

Figure 4:
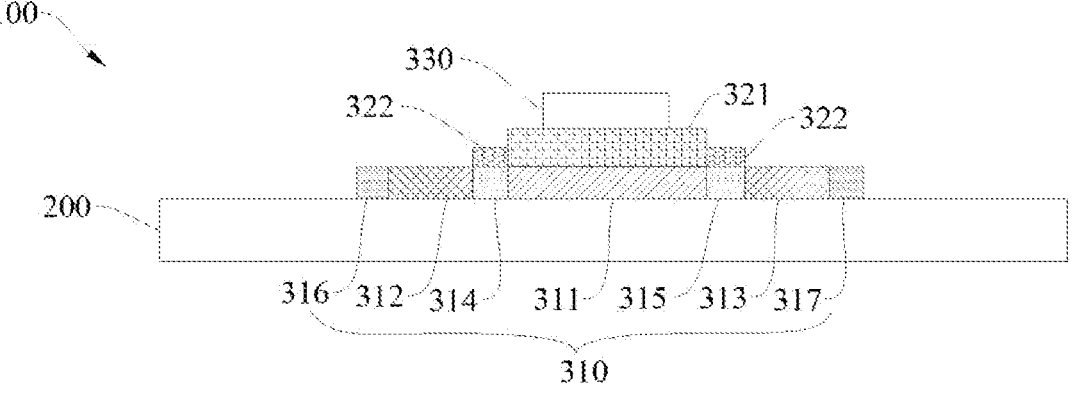
FIG. 4 is a schematic structural diagram of a third structure of a display panel provided by an embodiment of the present invention.

In some embodiments, referring to FIG. 4, the first active layer 310 further comprises a third diffusion region 316 located on a side of the first source conductor region 312 away from the first channel region 311, and a fourth diffusion region 317 located on a side of the first drain conductor region 313 away from the first channel region 311. Herein the oxygen vacancy concentration of the first source conductor region 312 is greater than the oxygen vacancy concentration of the third diffusion region of 316. The oxygen vacancy concentration of the first drain conductor region 313 is greater than the oxygen vacancy concentration of the fourth diffusion region 317.

When the first active layer 310 is made conductive through a self-aligned method and uses of the first gate 330 and the first gate insulating layer 320, it can be seen during the process flowchart that the plasma gas is used to treat the source and drain regions to reduce the resistance and make it conductive, the openings 362 are used to diffuse the source and drain regions on both sides, which can further shorten the width of the controlled diffusion region, ensure the effective channel length, prevent threshold voltage drift, and improve the quality of the display panel 100.

In some embodiments, the oxygen vacancy concentration of the first diffusion region 314 is equal to the oxygen vacancy concentration of the third diffusion region 316, and the oxygen vacancy concentration of the second diffusion region 315 is equal to the oxygen vacancy concentration of the fourth diffusion region 317. Taking the third diffusion region 316 as an example, that is, when the plasma gas is diffused, the plasma in the third diffusion region 316 does not diffused to reach the edge of the first active layer 310 or just diffuses to an edge of the first active layer 310.

In some embodiments, the oxygen vacancy concentration of the first diffusion region 314 is less than the oxygen vacancy concentration of the third diffusion region 316, and the oxygen vacancy concentration of the second diffusion region 315 is less than the oxygen vacancy concentration of the fourth diffusion region 317. Taking the third diffusion region 316 as an example, when the plasma gas is diffused, the plasma in the third diffusion region 316 diffuses to the edge of the first active layer 310 and are stacked at the edge.

In some embodiments, the oxygen vacancy concentration of the third diffusion region 316 is equal to the oxygen vacancy concentration of the first source conductor region 312, and the oxygen vacancy concentration of the fourth diffusion region 317 is equal to the first drain the quality of the first source conductor region 313. After diffusion of the plasma gas, the third diffusion region 316 and the fourth diffusion region 317 are in a saturated state, which is the same as the state of the first source conductor region 312 and the first drain conductor region 313.

Figure 5:
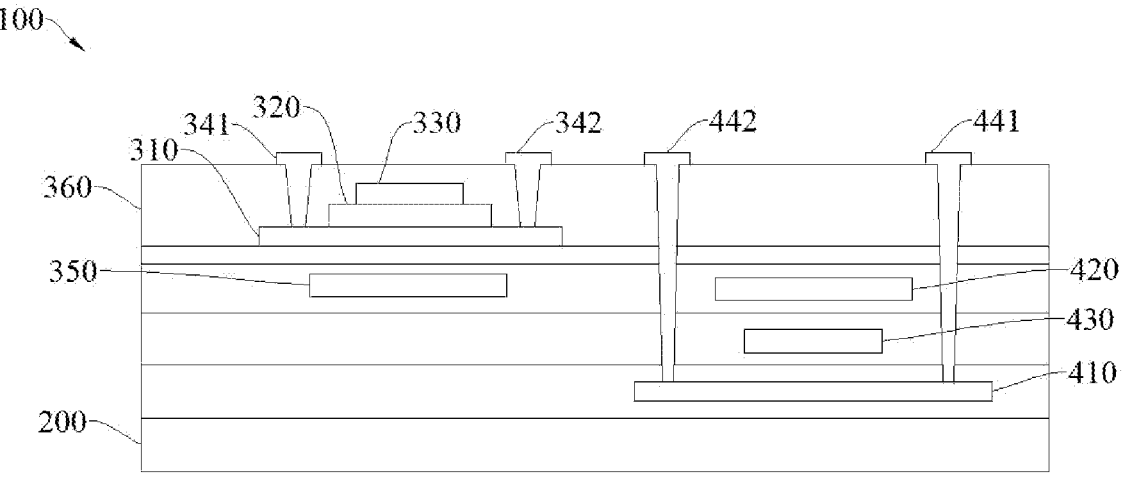
FIG. 5 is a schematic structural diagram of a fourth structure of a display panel provided by an embodiment of the present invention.

In some embodiments, referring to FIG. 5, the driving circuit layer further comprises a second gate 350 corresponding to the first gate 330, and the second gate 350 is located on a side of the first active layer 310 away from the first gate 330. The driving circuit layer further comprises a second active layer 410, a third gate 420, a fourth gate 430 located between the second active layer 410 and the third gate 420, and a second source 441 and a second drain 442 Herein, the third gate 420 and the second gate 350 are provided in the same layer, and the first source 341, the first drain electrode 342, the second source electrode 441, and the second drain electrode 442 are arranged in the same layer.

The first gate 330, the second gate 350, and the first active layer 310 constitute the first thin film transistor, the third gate 420, the fourth gate 430, and the second active layer 410 constitutes the second thin film transistor. The first gate 330 and the second gate 350 are described as an upper and lower double-gate design, the first gate 330 is a top gate, and the second gate 350 is a bottom gate, both controlling on and off of a thin film transistor. In the second thin film transistor, the fourth gate 430 serves as a gate switching signal, and the fourth gate 430 and the third gate 420 form a capacitor to control the gate terminal potential.

In some embodiments, the first active layer 310 comprises metal oxide, and the second active layer 410 comprises low temperature polysilicon (LTPS) thin film transistors and metal oxide thin film transistors integrated on the same display panel 100, which is able to combine the high mobility of low temperature polysilicon thin film transistors, the advantages of fast charging of pixel capacitors, and the advantage of low leakage current of the metal oxide thin film transistor.

In some embodiments, the display panel 100 further comprises an insulating material filled between different types of components. The insulating material may be an organic insulating material or an inorganic insulating material, and the organic insulating material may be polyimide. The inorganic insulating material can be any one of a silicon-oxygen compounds, a silicon-nitrogen compound, or a silicon-oxynitride compound, which is only an example here, and it can be specifically determined according to the actual process or actual situation, and is not specifically limited.

In some embodiments, the material of the first gate insulating layer 320 and all insulating film layers may be organic insulating materials or inorganic insulating materials. The organic insulating material can be polyimide, and the inorganic insulating material can be any of silicon-oxygen compounds, silicon-nitrogen compounds, or silicon-oxynitride compounds. This is just an example, and the specifics can be determined according to the actual process or actual situation. There is no specific limitation.

In some embodiments, the display panel 100 may be a liquid crystal display panel or an organic light-emitting display panel. The following description takes the display panel 100 as an organic light-emitting display panel as an example.

Figure 6:
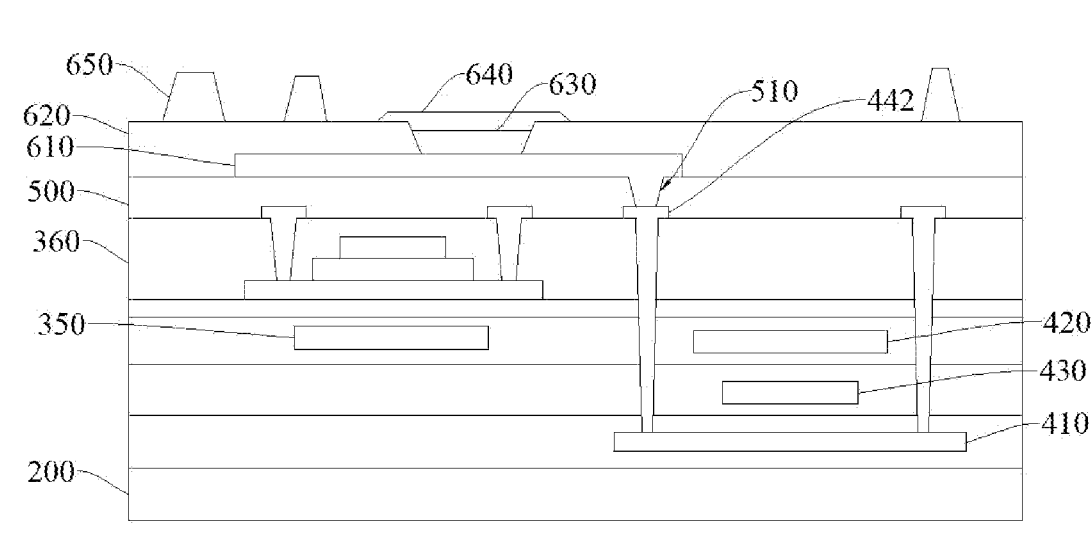
FIG. 6 is a schematic structural diagram of a fifth structure of a display panel provided by an embodiment of the present invention.

In some embodiments, referring to FIG. 6, the display panel 100 further comprises a planarization layer 500 on the first source-drain unit 340 and the second source-drain unit 440, and the planarization layer 500 includes A plurality of second openings 510.

In some embodiments, referring to FIG. 6, the display panel 100 further comprises an anode layer 610 located on the flat layer 500, a pixel definition layer 620 including a plurality of third openings located on the anode layer 610 and the luminescent material layer 630 in the third openings, the cathode layer 640 on the luminescent material layer 630, and the spacer 650 on the pixel defining layer 620. The anode layer 610 is electrically connected to the second source/drain unit 440 through the second opening 510.

In some embodiments, the display panel 100 further comprises an encapsulation layer and a cover plate on the cathode layer 640.

In the present invention, the size of the first gate is smaller than the size of the first gate insulating layer, the size of the first gate insulating layer is smaller than the size of the first active layer, and a distance of a diffusion region formed by the plasma gas is reserved when making the first active layer conductive through a self-aligned method and uses of the first gate and the first gate insulating layer, thereby effectively prevent the channel region from being shortened, ensuring the effective channel region length, preventing threshold voltage drift, and improving the quality of the display panel.

Figure 7:
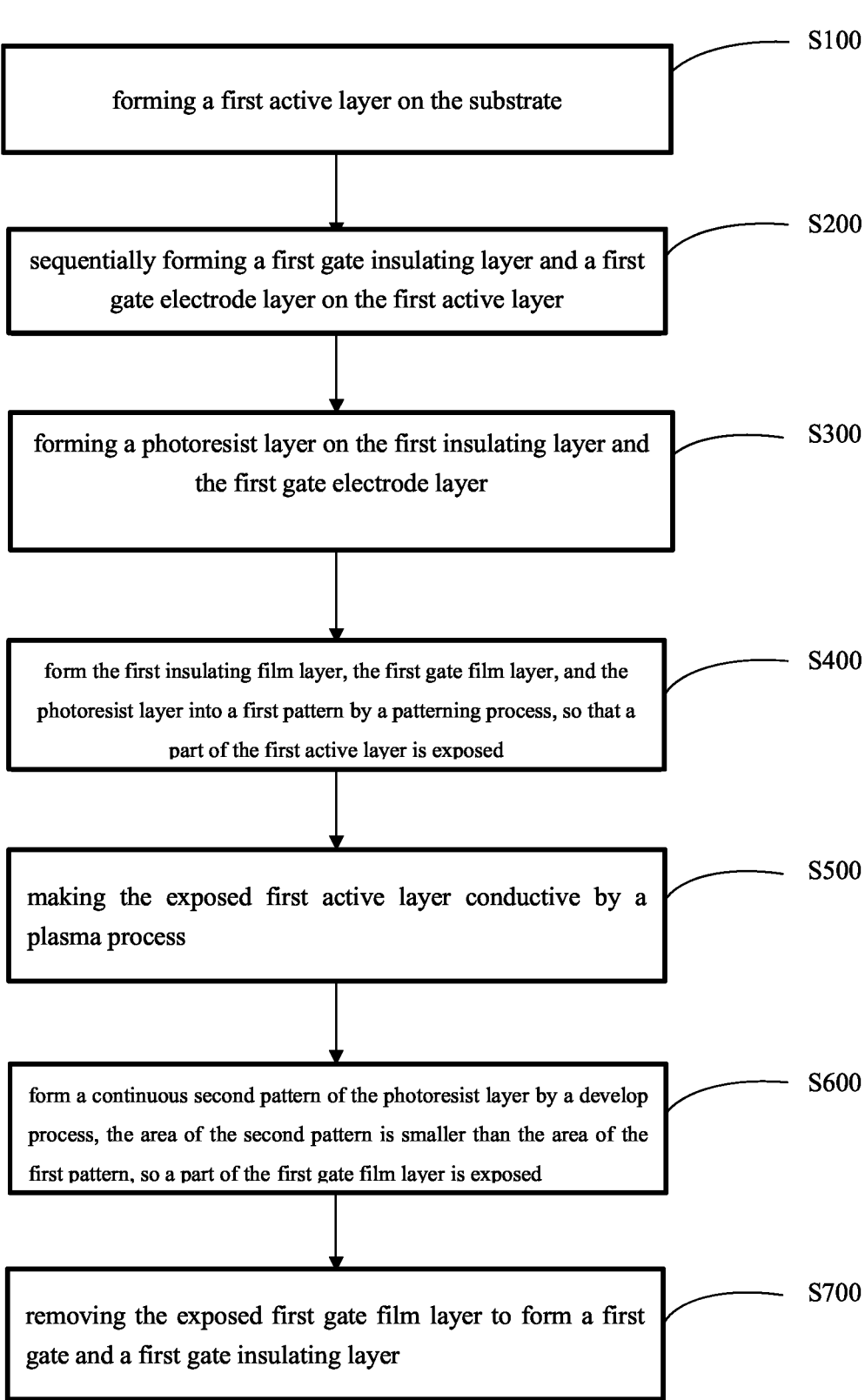
FIG. 7 is a first step flowchart of a fabrication method of a display panel provided by an embodiment of the present invention.

Referring to FIG. 7, an embodiment of the present invention also provides a fabrication method of the display panel 100, comprising following steps:

Step S100, forming a plurality of first active layers 310 on the substrate 200;

Step S200: sequentially forming a first insulating film layer 301 and a first gate film layer 302 on the first active layer 310;

Step S300, forming a photoresist layer 303 on the first insulating film layer 301 and the first gate film layer 302;

Step S400, form the first insulating film layer 301, the first gate film layer 302, and the photoresist layer 303 into a first pattern by a patterning process, so that a part of the first active layer 310 is exposed;

Step S500 making the exposed first active layer 310 conductive using a plasma process;

Step S600: forming a continuous second pattern of the photoresist layer 303 by a develop process, wherein the area of the second pattern is smaller than the area of the first pattern, so that a part of the first gate film layer 302 is exposed;

Step S700: removing the exposed first gate film layer 302 to form a first gate 330 and a first gate insulating layer 320.

In the present invention, the size of the first gate is smaller than the size of the first gate insulating layer, the size of the first gate insulating layer is smaller than the size of the first active layer, and a distance of a diffusion region formed by the plasma gas is reserved when making the first active layer conductive through a self-aligned method and uses of the first gate and the first gate insulating layer, thereby effectively prevent the channel region from being shortened, ensuring the effective channel region length, preventing threshold voltage drift, and improving the quality of the display panel.

Technical solutions of the present invention will now be described in conjunction with specific embodiments.

Figure 9A:
FIG. 9A to 9F are schematic diagrams of a first process of a fabrication method of a display panel provided by an embodiment of the present invention.

In Step S100, a plurality of first active layers 310 are formed on the substrate 200, please refer to FIG. 9A.

In some embodiments, the step S100 comprises:

Step S110, forming a plurality of second gates 350 on the substrate 200.

Step 120, forming an insulating material on the second gate 350.

Step 130, forming a plurality of first active layers 310 on the insulating material.

In some embodiments, the display panel 100 is filled with insulating materials between different types of components. The insulating materials may be organic insulating materials or inorganic insulating materials. The organic insulating materials may be polyimide or inorganic insulating materials. The material can be any one of silicon-oxygen compound, silicon-nitrogen compound or silicon-oxynitride compound. This is only an example. The specific material can be determined according to the actual process or actual situation, and there is no specific limitation. The material composition of the insulating material is not the original one. The focus of the invention is not to make precise distinctions.

Figure 9B:
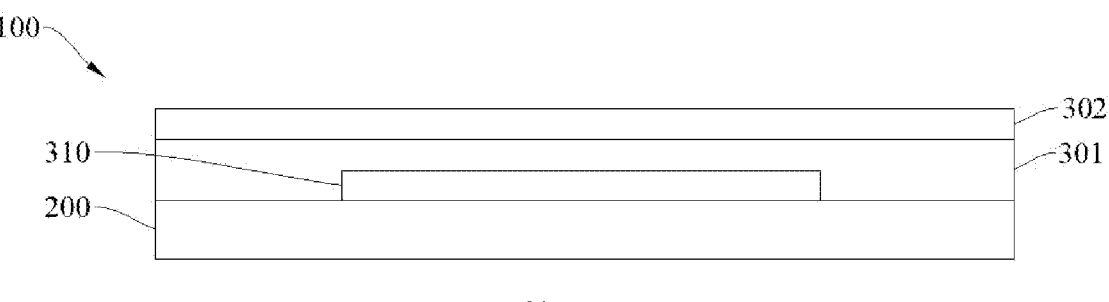

In step S200, a first insulating film layer 301 and a first gate film layer 302 are sequentially formed on the first active layer 310. Please refer to FIG. 9B.

In some embodiments, for step S200, the first insulating film layer 301 and the first gate film layer 302 are subsequently uniformly patterned, and the self-aligned method to make it conductive is then performed, which can save photomasks, reduce production costs, and increase productivity.

Figure 9C:
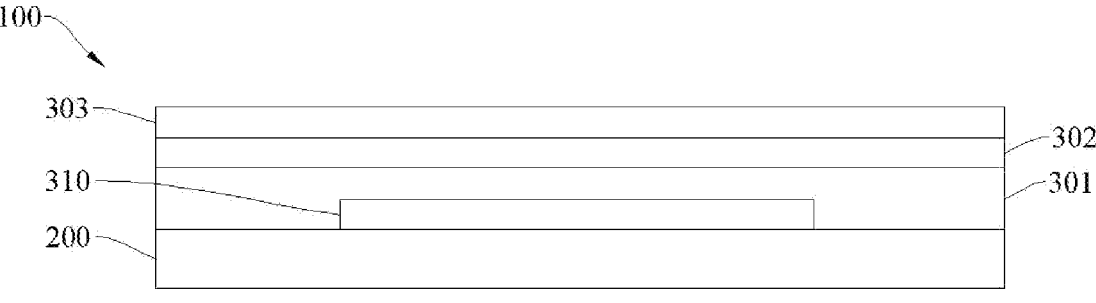

In Step S300, a photoresist layer 303 is on the first insulating film layer 301 and the first gate film layer 302, please refer to FIG. 9C.

In some embodiments, the material of the photoresist layer 303 is a photoresist material, and the material composition is not the focus of the present invention and is not specifically limited.

Figure 9D:
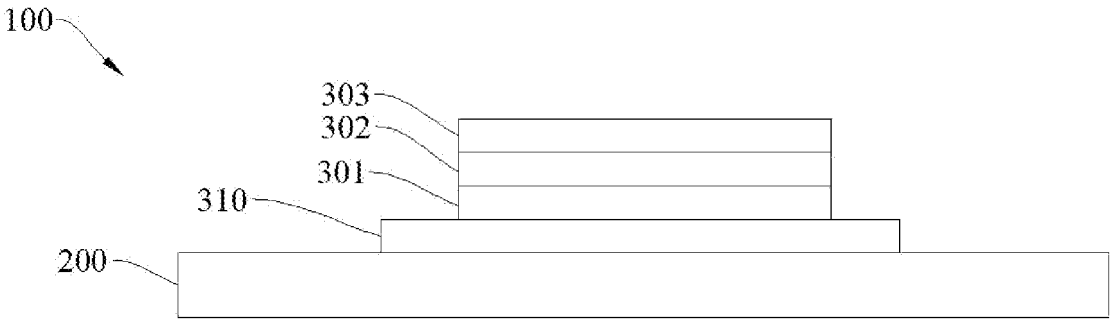

In Step S400, the first insulating film layer 301, the first gate film layer 302, and the photoresist layer 303 into a first pattern by a patterning process, so that a part of the first active layer 310 is exposed, please refer to FIG. 9D.

In some embodiments, in step S400, a part of the first active layer 310 is exposed, and the exposed area may be bombarded with plasma gas to be conductive.

In some embodiments, referring to FIG. 9D, step S400 may comprises:

In Step S410a, the first insulating film layer 301, the first gate film layer 302, and the photoresist layer 303 are formed into a first pattern by a patterning process, so that the periphery of the first active layer 310 exposed.

Figure 11A:
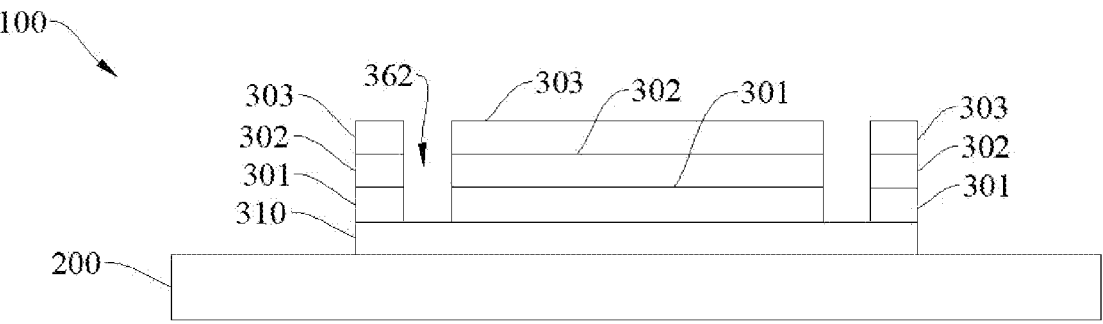
FIGS. 11A and 11B are schematic diagrams of a third process of a manufacturing method of a display panel provided by an embodiment of the present invention.

In some embodiments, referring to FIG. 11A, step S400 may comprise:

Step S410b: forming the first insulating film layer 301, the first gate film layer 302, and the photoresist layer 303 into a first pattern by a patterning process, wherein the first pattern including a plurality of openings 362.

In some embodiments, the photoresist layer 303 is provided around the openings 362.

Step S500: making the exposed first active layer 310 conductive by a plasma process.

Figure 9E:
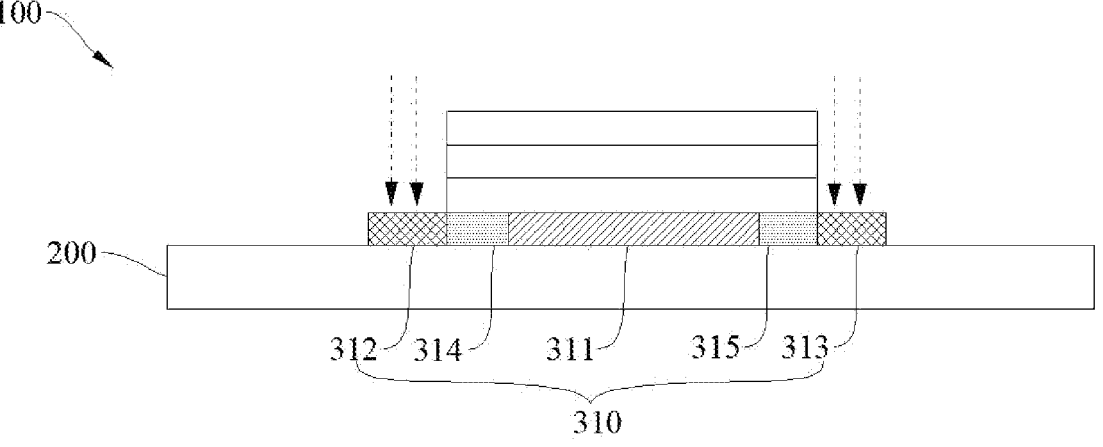
Figure 11B:
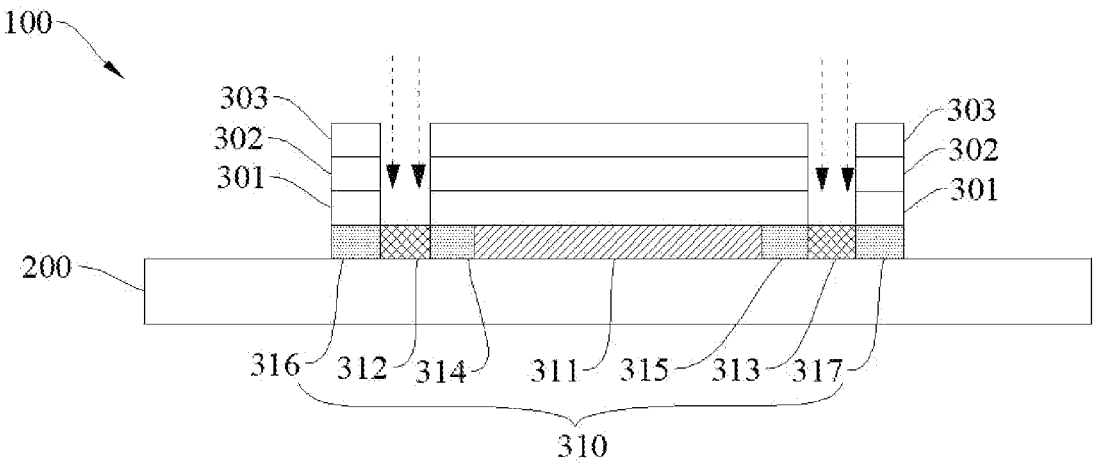

Please refer to FIG. 9E for step S500 of step S410a; refer to FIG. 11B for step S500 of step S410b. In the figure, the dashed arrow represents the plasma process. For processes that use plasma gas for bombardment and resistance reduction, for example, He, Ar, $CF_4$, etc., $CF_4$ can be measured in the final product F content or oxygen hole content, and for He and Ar, it is not easy to detect the content, so the oxygen vacancy concentration can be used as the distinction between different regions.

Figure 9F:
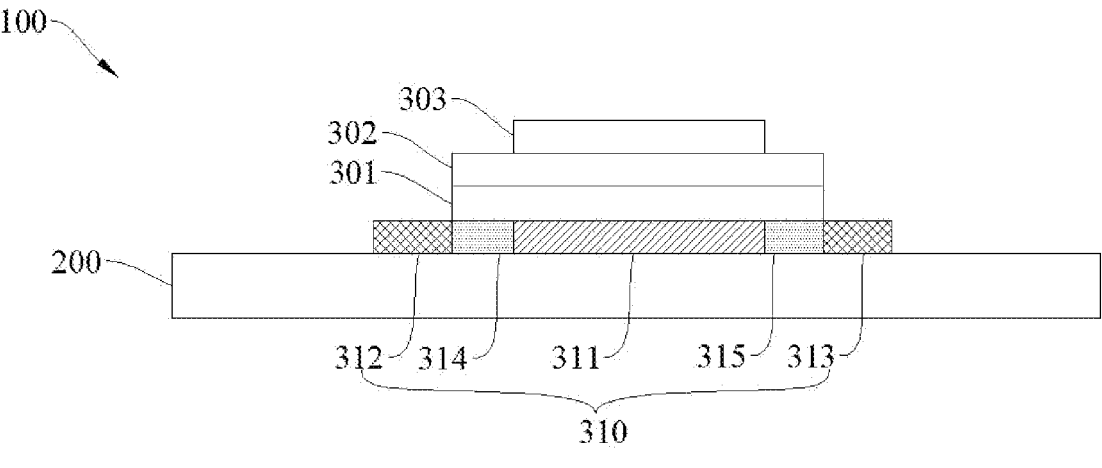

Step S600: forming a continuous second pattern of the photoresist layer 303 by a develop process, wherein the area of the second pattern is smaller than the area of the first pattern, so that a part of the first gate film layer 302 is exposed, see FIG. 9F.

In some embodiments, step S600 exposes the periphery of the first gate film layer 302 and shrinks the photoresist layer 303, so that the next step of shrinking the first gate film layer 302 can be performed to form the first gate 330 corresponding to the first active layer 310.

In some embodiments, the photoresist layer 303 of the second pattern corresponds to the center position of the first active layer 310, and the photoresist layer 303 around the opening 362 in step S410b is removed, so that the peripheral areas of the first active layer 310 are all exposed. In Step S800, the size of the first opening 361 can be reduced to prevent the size of the first opening 361 from being too large and causing the first source-drain unit 340 is collapsed or abnormally connected.

Step S700: removing the exposed first gate film layer 302 to form a first gate 330 and a first gate insulating layer 320.

In order to avoid repeated drawing, step S700 please refer to FIG. 1 or FIG. 2. The first gate film layer 302 that is not covered by the photoresist layer 303 is removed, thereby forming the first gate 330 corresponding to the first active layer 310.

In the step making the exposed first active layer 310 conductive of step S500, referring to FIGS. 1 and 2, the first active layer comprises a first source conductor region 312, a first channel region 311, a first drain conductor region 313, The first diffusion region 314 between the first source conductor region 312 and the first channel region 311, and the first diffusion region 314 between the first drain conductor region 313 and the first channel region 311 In the second diffusion region 315, the first source 341 is electrically connected to the first source conductor region 312, and the first drain 342 is electrically connected to the first drain conductor region 313; the first interlayer insulating layer 360 covers at least the first channel region 311, the first diffusion region 314, and the second diffusion region 315.

The first channel region 311 corresponds to the channel region of the semiconductor, the first source conductor region 312 and the first drain conductor region 313 correspond to the source and drain regions, which are the conductive regions having strong conductivity. The first diffusion region 314 and the second diffusion region 315 correspond to the diffusion region of the plasma gas, having a resistance between the first channel region and the regions which are made conductive. A distance of a diffusion region formed by the plasma gas is reserved, which effectively prevents the channel from being shortened, ensures the effective channel length, prevent the threshold voltage from drifting, and improves the quality of the display panel 100.

In some embodiments, referring to FIGS. 2 and 3, the first gate insulating layer 320 comprises a first unit 321 corresponding to the first gate 330, and a first unit 321 located outside the first unit 321, and the first unit 321 is connected to the second unit 322, wherein the thickness of the second unit 322 is smaller than the thickness of the first unit 321.

After the first active layer 310 is made conductive by a self-align method and uses of the first gate 330 and the first gate insulating layer 320, the distance of the diffusion area of the plasma gas is reserved. In the direction of the carrier migration, after the first gate 330 is etched corresponding to the plasma gas diffusion distance, the first gate insulating layer 320 that is not covered by the first gate 330 will also be affected. Therefore, in the display panel 100 fabricated by the method of the present invention, the thickness of the second unit 322 is smaller than the thickness of the first unit 321, and this structure can be used as an anti-counterfeiting mark.

Figure 8:
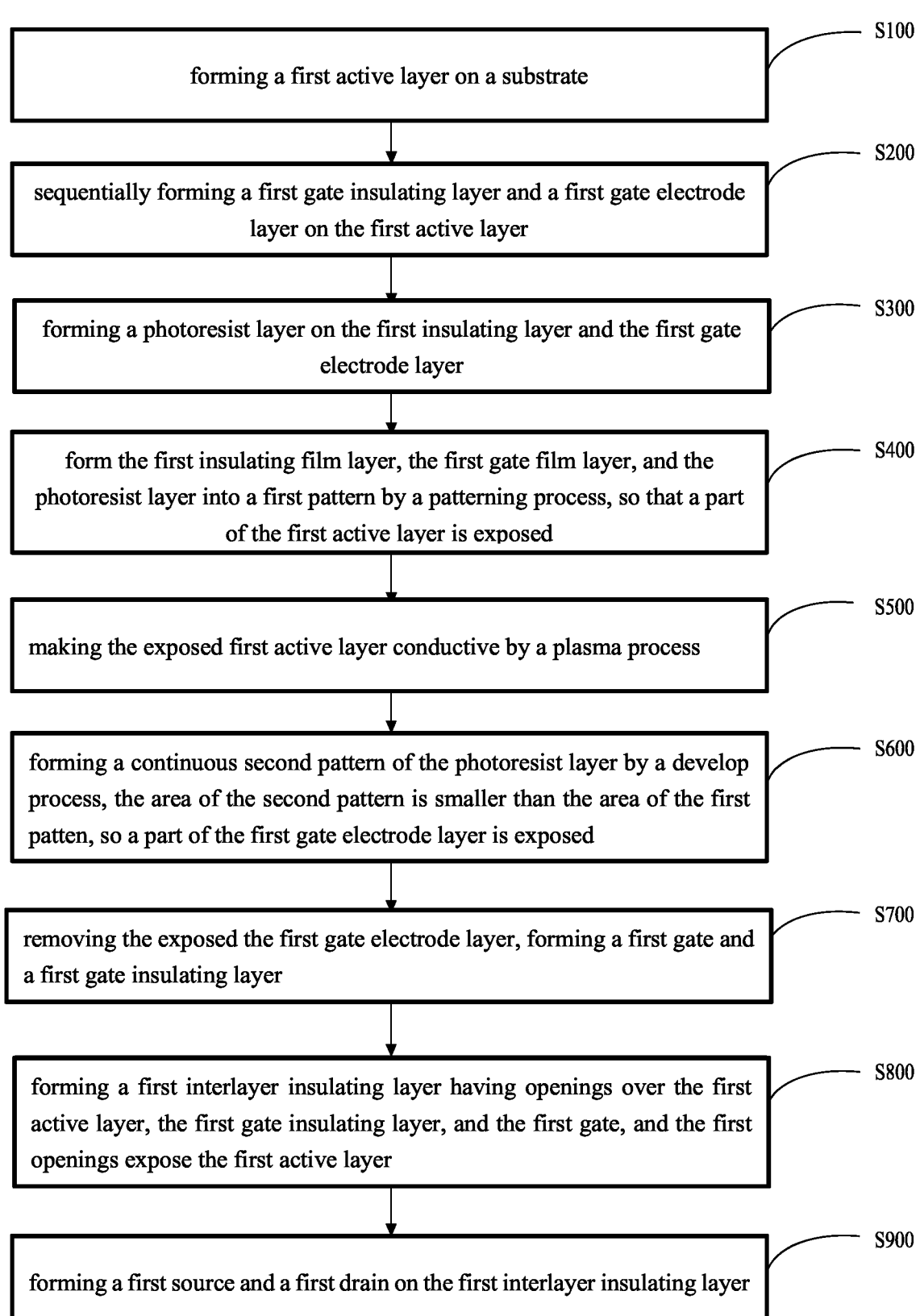
FIG. 8 is a second step flowchart of a fabrication method of the display panel provided by the embodiment of the present invention.
Figure 10:
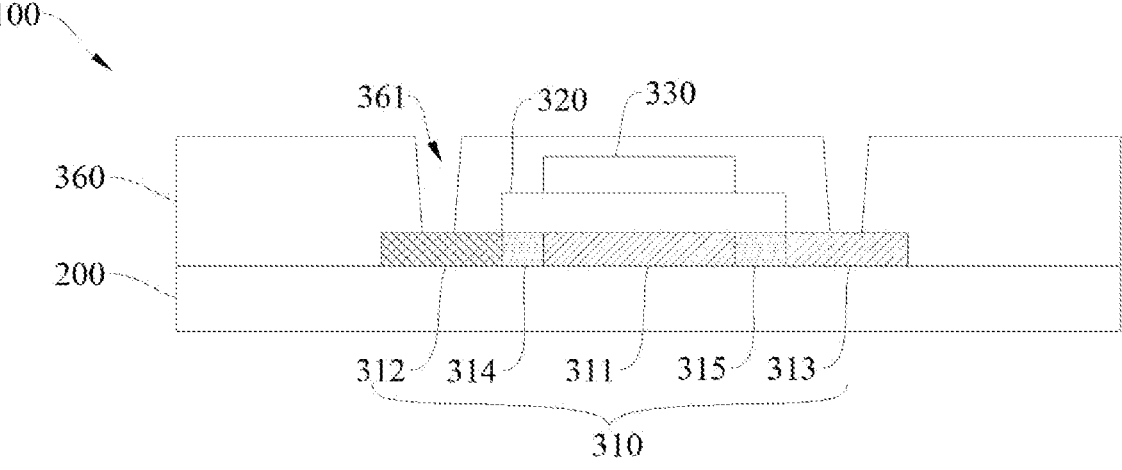
FIG. 10 is a schematic diagram of a second process of a fabrication method of a display panel according to an embodiment of the present invention.

In some embodiments, referring to FIG. 8, the fabrication method of the display panel 100 further comprises following steps:

S800, forming a first interlayer insulating layer 360 including a plurality of first openings 361 on the first active layer 310, the first gate insulating layer 320, and the first gate 330, so the first opening 361 exposes the first active layer 310, please refer to FIG. 10 or FIG. 11A.

In some embodiments, for convenience of description, the insulating material between the first active layer 310 and the first source/drain unit 340 is a first interlayer insulating layer 360, and the material of the first interlayer insulating layer 360 is an insulating material.

Step S900, forming a first source 341 and a first drain 342 on the first interlayer insulating layer 360.

To avoid repeated drawing, please refer to FIG. 1 in step S900. In some embodiments, the first source 341 and the first drain 342 are electrically connected to the first active layer 310 through the first opening 361.

In some embodiments, referring to FIG. 5, the driving circuit layer further comprises a second gate 350 corresponding to the first gate 330, and the second gate 350 is located a side on the first active layer 310 away from the first gate 330. The driving circuit layer further comprises a second active layer 410, a third gate 420, a fourth gate 430 located between the second active layer 410 and the third gate 420, and the second source 441 and the second drain 442, wherein the third gate 420 and the second gate 350 are provided in the same layer, and the first source 341, the first drain electrode 342, the second source electrode 441 and the second drain electrode 442 are arranged in the same layer.

In the present invention, the size of the first gate is smaller than the size of the first gate insulating layer, the size of the first gate insulating layer is smaller than the size of the first active layer, and the first gate and the first gate insulating layer When an active layer is self-aligned and conductive, the distance of the diffusion region of the plasma gas is reserved to effectively prevent the channel region from being shortened, ensure the effective channel region length, prevent threshold voltage drift, and improve the quality of the display panel.

Figure 12:
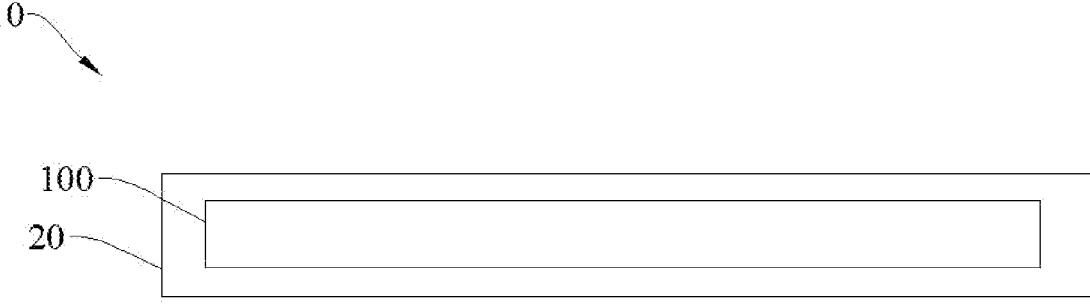
FIG. 12 is a schematic structural diagram of a mobile terminal provided by an embodiment of the present invention.

Referring to FIG. 12, an embodiment of the present invention also provides a mobile terminal 10, including any of the above-mentioned display panel 100 and a terminal body 20, and the terminal body 20 and the display panel 100 are combined into one body.

The technical solution of the present invention will now be described in conjunction with specific embodiments.

For the specific structure of the display panel 100, please refer to any of the above-mentioned embodiments of the display panel 100 and FIGS. 1 to 6, which will not be repeated here.

Embodiments of the present invention disclose a display panel, a fabricated method thereof, and a mobile terminal. The display panel comprises a substrate and a driving circuit layer, and the driving circuit layer comprises a first active layer, a first gate insulating layer, and a first gate electrode, first interlayer insulating layer, and first source and first drain. The orthographic projection of the first gate insulating layer on the substrate is within the orthographic projection of the first active layer on the substrate, the orthographic projection of the first grid on the substrate is within the orthographic projection of the first grid insulating layer on the substrate. In the present invention, the size of the first gate is smaller than the size of the first gate insulating layer, the size of the first gate insulating layer is smaller than the size of the first active layer, and a distance of a diffusion region formed by the plasma gas is reserved when making the first active layer conductive through a self-aligned method and uses of the first gate and the first gate insulating layer, thereby effectively prevent the channel region from being shortened, ensuring the effective channel region length, preventing threshold voltage drift, and improving the quality of the display panel.

For those skilled in the art, according to the idea of the present application, there will be changes in the specific implementation and scope of application. In summary, the content of the present specification should not be construed as a limitation to the present application.

What is claimed is:

1. A display panel, comprising:

a substrate; and a driving circuit layer arranged on a side of the substrate, wherein the driving circuit layer comprises a first active layer, a first gate insulating layer arranged on a side of the first active layer away from the substrate, a first gate arranged on a side of the first gate insulating layer away from the substrate, a second gate corresponding to the first gate, a first interlayer insulating layer arranged on a side of the first gate away from the substrate, a first source and a first drain arranged on a side of the first interlayer insulating layer away from the substrate, a second active layer, a third gate, a fourth gate located between the second active layer and the third gate, a second source, and a second drain; wherein the second gate is located on a side of the first active layer far away from the first gate, the third gate and the second gate are arranged in a same layer, and the first source and the second source are arranged in a same layer, and the first drain and the second drain are arranged in a same layer, wherein an orthographic projection of the first gate insulating layer on the substrate is within an orthographic projection of the first active layer on the substrate, and an orthographic projection of the first gate on the substrate is located within an orthographic projection of the first gate insulating layer on the substrate.

2. The display panel of claim 1, wherein the first active layer comprises a first source conductor region, a first channel region, a first drain conductor region, a first diffusion region between the first source conductor region and the first channel region, and a second diffusion region between the first drain conductor region and the first channel region, wherein the first source is electrically connected to the first source conductor region, and the first drain is electrically connected to the first drain conductor region; and wherein the first interlayer insulating layer covers at least the first channel region, the first diffusion region, and the second diffusion region.

3. The display panel of claim 2, wherein an orthographic projection of the first gate insulating layer on the substrate completely overlaps orthographic projections of the first channel region, the first diffusion region, and the second diffusion region on the substrate, and an orthographic projection of the first gate on the substrate completely overlaps an orthographic projection of the first channel region on the substrate.

4. The display panel of claim 2, wherein the first active layer comprises a plurality of oxygen vacancies;

oxygen vacancy concentrations of the first source conductor region and the first drain conductor region are both greater than oxygen vacancy concentrations of the first diffusion region and the second diffusion region; and the oxygen vacancy concentrations of the first diffusion region and the second diffusion region are both greater than an oxygen vacancy concentration of the first channel region.

5. The display panel of claim 4, wherein the first active layer further comprises a third diffusion region located on a side of the first source conductor region away from the first channel region, and a fourth diffusion region located on a side of the first drain conductor region away from the first channel region;

wherein, the oxygen vacancy concentration of the first source conductor region is greater than an oxygen vacancy concentration of the third diffusion region, and the oxygen vacancy concentration of the first drain conductor region is greater than an oxygen vacancy concentration of the fourth diffusion region.

6. The display panel of claim 2, wherein a ratio of a sum of a width of the first diffusion region and a width of the second diffusion region to a width of the first channel region is less than 1:1.

7. The display panel of claim 1, wherein the first gate insulating layer comprises a first cell corresponding to the first gate and a second cell located outside the first cell, and the first cell is connected to the second cell; and wherein a thickness of the second cell is smaller than a thickness of the first cell.

8. A mobile terminal including a display panel and a mobile body, wherein the mobile body is integrated with the display panel:

wherein the display panel comprises:

a substrate;

a driving circuit layer arranged on a side of the substrate, wherein the driving circuit layer comprises a first active layer, a first gate insulating layer arranged on a side of the first active layer away from the substrate, a first gate arranged on a side of the first gate insulating layer away from the substrate, a second gate corresponding to the first gate, a first interlayer insulating layer arranged on a side of the first gate away from the substrate, a first source and a first drain arranged on a side of the first interlayer insulating layer away from the substrate, a second active layer, a third gate, a fourth gate located between the second active layer and the third gate, a second source, and a second drain; wherein the second gate is located on a side of the first active layer far away from the first gate, the third gate and the second gate are arranged in a same layer, and the first source and the second source are arranged in a same layer, and the first drain and the second drain are arranged in a same layer;

wherein an orthographic projection of the first gate insulating layer on the substrate is within an orthographic projection of the first active layer on the substrate, and an orthographic projection the first gate on the substrate is located within an orthographic projection of the first gate insulating layer on the substrate.

9. The mobile terminal of claim 8, wherein the first active layer comprises a first source conductor region, a first channel region, a first drain conductor region, and a first diffusion region between the first source conductor region and the first channel region, and a second diffusion region between the first drain conductor region and the first channel region, wherein the first source is electrically connected to the first source conductor region, and the first drain is electrically connected to the first drain conductor region; and wherein the first interlayer insulating layer covers at least the first channel region, the first diffusion region, and the second diffusion region.

10. The mobile terminal of claim 9, wherein, an orthographic projection of the first gate insulating layer on the substrate completely overlaps orthographic projections of the first channel region, the first diffusion region, and the second diffusion region on the substrate, and an orthographic projection of the first gate on the substrate completely overlaps an orthographic projection of the first channel region on the substrate.

11. The mobile terminal of claim 9, wherein the first active layer includes a plurality of oxygen vacancies;

oxygen vacancy concentrations of the first source conductor region and the first drain conductor region are both greater than oxygen vacancy concentrations of the first diffusion region and the second diffusion region; and the oxygen vacancy concentrations of the first diffusion region and the second diffusion region are both greater than an oxygen vacancy concentration of the first channel region.

12. The mobile terminal of claim 11, wherein the first active layer further comprises a third diffusion region located on a side of the first source conductor region away from the first channel region, and a fourth diffusion region located on a side of the first drain conductor region away from the first channel region;

wherein, the oxygen vacancy concentration of the first source conductor region is greater than an oxygen vacancy concentration of the third diffusion region, and the oxygen vacancy concentration of the first drain conductor region is greater than an oxygen vacancy concentration of the fourth diffusion region.

13. The mobile terminal of claim 9, wherein a ratio of a sum of a width of the first diffusion region and a width of the second diffusion region to a width of the first channel region is less than 1:1.

14. The mobile terminal of claim 9, wherein the first gate insulating layer comprises a first cell corresponding to the first gate and a second cell located outside the first cell, and the first cell is connected to the second cell; and wherein a thickness of the second cell is smaller than a thickness of the first cell.

15. The display panel of claim 1, wherein the first gate is a top gate, and the second gate is a bottom gate, and both the first gate and the second gate control on and off of a thin film transistor.

16. The display panel of claim 1, wherein the first active layer comprises metal oxide, and the second active layer comprises low temperature polysilicon.

17. The display panel of claim 1, further comprising a planarization layer on the first source and the first drain as well as the second source and the second drain, and the planarization layer comprising a plurality of second openings.

18. The display panel of claim 17, further comprising an anode layer located on the planarization layer, a pixel definition layer comprising a plurality of third openings located on the anode layer, a luminescent material layer in the third openings, a cathode layer on the luminescent material layer; wherein the anode layer is electrically connected to the second source and the second drain through the second openings.

19. The mobile terminal of claim 8, wherein the first gate is a top gate, and the second gate is a bottom gate, and both the first gate and the second gate control on and off of a thin film transistor.

20. The mobile terminal of claim 8, wherein the first active layer comprises metal oxide, and the second active layer comprises low temperature polysilicon.

\*   \*   \*   \*   \*